US011243248B2

United States Patent
Liu et al.

(10) Patent No.: US 11,243,248 B2
(45) Date of Patent: Feb. 8, 2022

(54) SYMBOLIC BACKEND FOR EXECUTION OF QUANTUM PROGRAMS

(71) Applicant: International Business Machines Corporation, Armonk, NY (US)

(72) Inventors: Peng Liu, Yorktown Heights, NY (US); Marco Pistoia, Amawalk, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 411 days.

(21) Appl. No.: 16/157,776

(22) Filed: Oct. 11, 2018

(65) Prior Publication Data

US 2020/0116784 A1 Apr. 16, 2020

(51) Int. Cl.
*G01R 31/317* (2006.01)
*G06N 10/00* (2019.01)

(52) U.S. Cl.
CPC .. *G01R 31/31703* (2013.01); *G01R 31/31702* (2013.01); *G06N 10/00* (2019.01)

(58) Field of Classification Search
CPC ........ G01R 31/31702; G01R 31/31703; G06N 10/00
See application file for complete search history.

(56) References Cited

U.S. PATENT DOCUMENTS

| 9,026,574 | B2 | 5/2015 | Macready et al. |
| 9,208,280 | B2 | 12/2015 | Bocharov et al. |
| 9,514,415 | B2 | 12/2016 | Bocharov et al. |
| 10,402,743 | B1* | 9/2019 | Rigetti ................ G06F 15/16 |
| 10,664,249 | B2* | 5/2020 | Amy .................... G06F 8/436 |
| 2006/0123363 | A1 | 6/2006 | Williams et al. |
| 2017/0147303 | A1 | 5/2017 | Amy et al. |
| 2018/0181685 | A1 | 6/2018 | Roetteler et al. |

FOREIGN PATENT DOCUMENTS

WO 2014015200 1/2014

OTHER PUBLICATIONS

Reid, "On the Evolutionary Design of Quantum Circuits," A thesis presented to the University of Waterloo in fulfillment of the thesis requirement for the degree of Master of Mathematics in Combinatorics and Optimization, Waterloo, Ontario, Canada, 2005, 93 pages.

* cited by examiner

*Primary Examiner* — Roy Y Yi
*Assistant Examiner* — Geoffrey T Evans
(74) *Attorney, Agent, or Firm* — Amin, Turocy & Watson, LLP (57) ABSTRACT

Symbolic backend for execution of quantum programs is provided. A parser receives an input qasm and parses it as a circuit graph. A layering component segments the circuit graph into multiple layers. An evaluation engine reads respective layers, translates the respective layers into a mathematic expression over qubits, and performs a simplification of the input qasm. A checker determines whether the input qasm and the simplified qasm are equivalent.

20 Claims, 9 Drawing Sheets

SYMBOLIC BACKEND FOR EXECUTION OF QUANTUM PROGRAMS

TECHNICAL FIELD

The subject disclosure relates generally to a quantum based symbolic checking tool that can determine output equivalence of various circuits that have been modified for optimization, by utilizing symbolic representations of qubit vectors and irreducible mathematical expressions.

SUMMARY

The following presents a summary to provide a basic understanding of one or more embodiments of the invention. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products that facilitate learned predictability of humans being able to discriminate between odor mixtures.

According to an embodiment, a system, comprising: a memory that stores computer-executable components; a processor, operably coupled to the memory, and that executes the computer-executable components stored in the memory, wherein the computer-executable components comprise: a parser component that receives an input QASM (Quantum Assembly Language) and parses it as a circuit graph.

In accordance with another embodiment, a layering component that segments the circuit graph into multiple layers.

In accordance with another embodiment, an evaluation engine that reads respective layers, translates the respective layers into a mathematic expression over qubits, and performs a simplification of the input QASM.

In accordance with another embodiment, a checker that determines whether the input QASM and the simplified QASM are equivalent.

DETAILED DESCRIPTION

The following detailed description is merely illustrative and is not intended to limit embodiments and/or application or uses of embodiments. Furthermore, there is no intention to be bound by any expressed or implied information presented in the preceding Summary section, or in the Detailed Description section. One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference. Superconducting qubits offer a promising path toward constructing fully-operational quantum computers. This is because they can exhibit quantum-mechanical behavior (allowing them to be used for quantum information processing) at the macroscopic level (allowing them to be designed and fabricated by existing integrated circuit technologies).

A quantum computation uses the Qubit as its fundamental unit instead of the classical computing bit. The qubit (e.g., quantum binary digit) is the quantum-mechanical analogue of the classical bit. Whereas classical bits can take on only one of two basis states (e.g., 0 or 1), qubits can take on superpositions of those basis states (e.g., $\alpha|0\rangle+\beta|1\rangle$, where $\alpha$ and $\beta$ are complex scalars such that $|\alpha|2+|\beta|2=1$), allowing a number of qubits to theoretically hold exponentially more information than the same number of classical bits. Thus, quantum computers (e.g., computers that employ qubits instead of solely classical bits) can, in theory, quickly solve problems that would be extremely difficult for classical computers.

The bits of a classical computer are just binary digits, with a value of either 0 or 1. Almost any device with two distinct states can serve to represent a classical bit: a switch, a valve, a magnet, a coin. Qubits, partaking of the quantum mystique, can occupy a superposition of 0 and 1 states. It's not that the qubit can have an intermediate value, such as 0.63; when the state of the qubit is measured, the result is always 0 or 1. But in the course of a computation a qubit can act as if it were a mixture of states—say, 63 percent 0 and 37 percent 1.

General quantum programs require coordination of quantum and classical parts of the computation. One way to think about general quantum programs is to identify their processes and abstractions involved in specifying a quantum algorithm, transforming the algorithm into executable form, running an experiment or simulation, and analyzing the results. A key idea throughout these processes is the use of intermediate representations. An intermediate representation (IR) of a computation is neither its source language description, nor the target machine instructions, but something in between. Compilers may use several IRs during the process of translating and optimizing a program. The input is source code describing a quantum algorithm and any compile time parameters. The output is a combined quantum/classical program expressed using a high level IR. An important distinction between quantum and classical computers is that a quantum computer is probabilistic, thus these measurements of algorithmic outputs only give the proper solution within an algorithm specific confidence interval. The computation is then repeated until satisfactory probable certainty of solution can be achieved.

The input for quantum computing can be a quantum/classical program which can be expressed in multiple ways. For this subject matter the quantum formatting language named QASM will be utilized. QASM is a simple text-format language for describing acyclic quantum circuits composed from single qubit, multiply controlled single-qubit gates, multiple-qubit, and multiple-qubit controlled multiple-qubit gates. Quantum Assembly Language (OpenQASM) is an intermediate representation for quantum instructions.

OpenQASM represents universal physical circuits over the CNOT plus SU(2) basis with straight-line code that includes measurement, reset, fast feedback, and gate subroutines. A quantum circuit is a device that performs a unitary transformation on a quantum state involving a finite number of qubits. Quantum circuits can be represented using mathematical objects called graphs, which are diagrams constructed from points and line segments. Graphs provide useful insights and surprising connections between quantum information theory and other areas of physics.

A quantum gate is just a "simple" quantum circuit, viewed as a building block from which more complicated quantum circuits may be constructed. There is no precise rule for how simple a quantum circuit must be to be considered a quantum gate, but most quantum gates manipulate only a few qubits. The simplest type of quantum gate performs a unitary transformation on single-qubit states. Such a quantum gate is called a single-qubit gate The embodiments core function is a symbolic end to end tool that can compare quantum circuits and provide an output equivalency check between the circuits. In other words, do 2 different circuits produce an equivalent output. The end-to-end tool produces the symbolic output form. The tool consists of: a parser, which accepts the input QASM and parses it as a circuit graph, a scheduler, which breaks the circuit graph into multiple layers, a mathematic evaluation engine, which reads each layer, translates it to a mathematic expression over the qubits, and performs the evaluation and simplification, and equivalence checker, which can check whether the outputs from two QASM files are equivalent. The embodiments are based on symbolic representation, for example, each Qubit set can be represented as a vector, and mathematical expressions of Qubit vectors that correspond to that Quantum circuit are created. The symbolic representation of the Qubit vector can be a irreducible mathematical expression and can describe the amplitude of the Qubit vector. The embodiments also can be used as a single-step debugger for the steps of the process. Like in the classical debugging, the debugger allows the users to query the states after every step and reason about its correctness.

The embodiments can be interpreted to function correctly in theory and can be tested by pairs of QASM programs that are equivalent and pairs of QASM programs that are inequivalent run against the tool for verification. For the evaluation of this tool, there are rules that can be followed to derive a subset of equivalent QASM programs.

Figure 1:
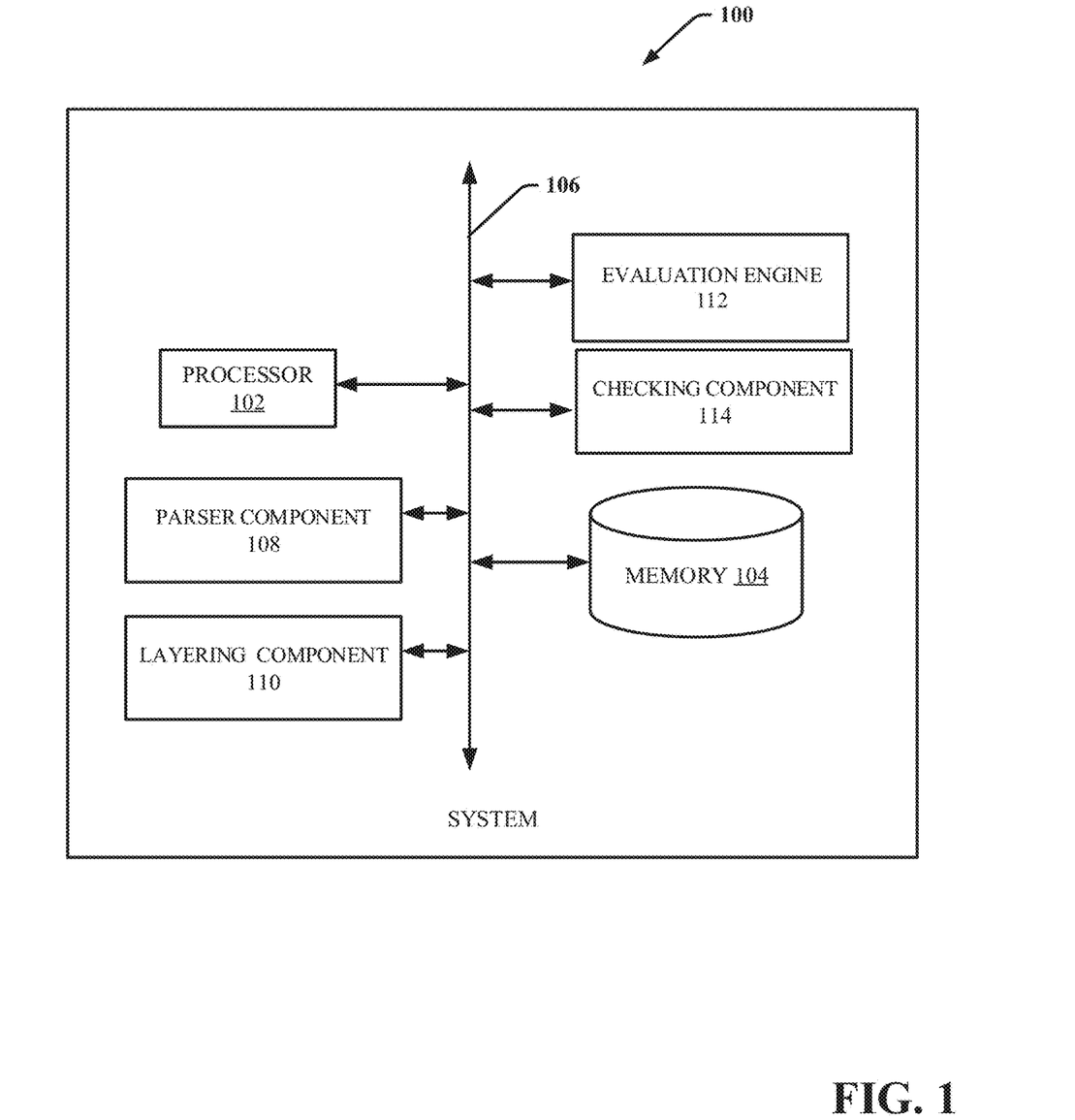
FIG. 1 illustrates a block diagram of an example system implemented that can function as a symbolic end to end tool to verify quantum circuit equivalency.

FIG. 1 illustrates a block diagram of an example system 100 implemented that can access data and process that data using variable computing components depicted in accordance with one or more embodiments described herein. The system 100 can facilitate a process of assessing and identifying a large amount of various forms of data, and using machine learning, training a neural network or other type of model. The system 100 can also generate predictive recommendations to an individual level resulting in a context in accordance with one or more embodiments described herein. Aspects of systems (e.g., system 100 and the like), apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. Repetitive description of like elements employed in one or more embodiments described herein is omitted for sake of brevity.

System 100 can optionally include a server device, one or more networks and one or more devices (not shown). The system 100 can also include or otherwise be associated with at least one processor 102 that executes computer executable components stored in memory 104. The system 100 can further include a system bus 106 that can couple various components including, but not limited to, a parsing component 108 that receives the input QASM program and parses it as a circuit graph, a layering component 110 that segments the circuit graph into multiple circuit layers, an evaluation engine component 112 that reads respective layers, translates the respective layers into a mathematic expression over qubits, and performs a simplification of the input QASM and a checking component 114 that determines whether the input QASM and the simplified QASM are equivalent.

The system 100 can be any suitable computing device or set of computing devices that can be communicatively coupled to devices, non-limiting examples of which can include, but are not limited to, a server computer, a computer, a mobile computer, a mainframe computer, an automated testing system, a network storage device, a communication device, a web server device, a network switching device, a network routing device, a gateway device, a network hub device, a network bridge device, a control system, or any other suitable computing device. A device can be any device that can communicate information with the system 100 and/or any other suitable device that can employ information provided by system 100. It is to be appreciated that system 100, components, models or devices can be equipped with communication components (not shown) that enable communication between the system, components, models, devices, etc. over one or more networks.

In accordance with the system 100, a memory 104 can store computer executable components executable by the processor 102. The parsing component 108 will represent the QASM software in graphical circuit form so the text is converted into a quantum circuit that can be represented using mathematical objects called graphs, which are diagrams constructed from points and line segments. The layering component 110 will segment the entire circuit into multiple layers to assist in isolating a one to one correlation for individual layers to math expressions. The evaluation engine component 112 will assess each layer individually and develop mathematical irreducible expressions over the Qubits. The checking component 114 will take output of the evaluation engine and make the final determination if the primary quantum circuit has an equivalent output to the simplified circuit. This is conducted for the entire circuit and not for each layer.

The various components of system 100 can be connected either directly or via one or more networks. Such networks can include wired and wireless networks, including, but not limited to, a cellular network, a wide area network (WAN) (e.g., the Internet), or a local area network (LAN), non-limiting examples of which include cellular, WAN, wireless fidelity (Wi-Fi), Wi-Max, WLAN, radio communication, microwave communication, satellite communication, optical communication, sonic communication, or any other suitable communication technology. Moreover, the aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components can be combined into a single component providing aggregate functionality. The components can also interact with one or more other components not specifically described herein for the sake of brevity, but known by those of skill in the art.

The subject computer processing systems, methods apparatuses and/or computer program products can be employed to solve new problems that arise through advancements in technology, computer networks, the Internet and the like.

Figure 2:
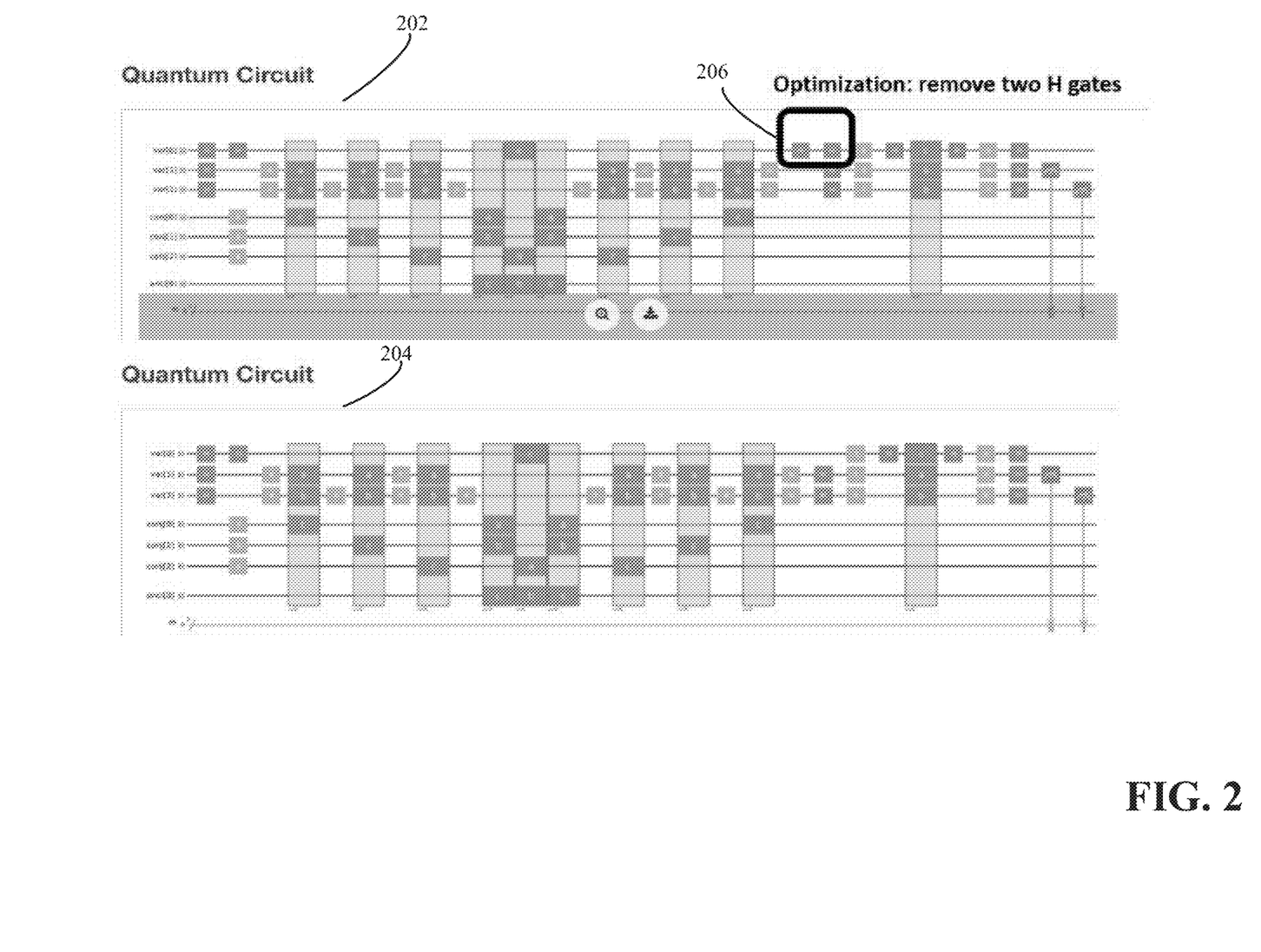
FIG. 2 illustrates 2 quantum circuits that are used for output equivalency checking after 2 H gates have been removed from 1 of the circuits.

FIG. 2 illustrates the basic concept of comparing 2 similar quantum circuits. The example on this drawing can be a typical representation of a quantum circuit and its basic logic gates and connections. Quantum circuit 1 is labeled as 202 and depicts the various states and gates of the circuit. Quantum circuit 2 is labeled as 204 and also depicts the various states and gates for the circuit. The idea is the checking tool would be utilized by processing each circuit through the tool's steps and generating an answer to the question are the 2 circuit outputs equivalent or not. So, for this example, both circuits are initially identical therefore would have equivalent outputs. At this point, a modification in circuit 1 (202) is made for optimization. In 202, 2 H gates (206) are removed from the quantum circuit and the tool would check to see if the output of both circuits (202 & 204) would still be equivalent even though 2 H gates were removed from circuit 202. For this example, the 2 gates are removed for optimization but any modification for any quantum circuit could be tested for output utilizing this end to end tool. This could apply to changing the states of various devices in a quantum circuit as in adding new gates, deleting gates or even switching gates from (for example a AND to a NAND gate or vice versa).

Figure 3:
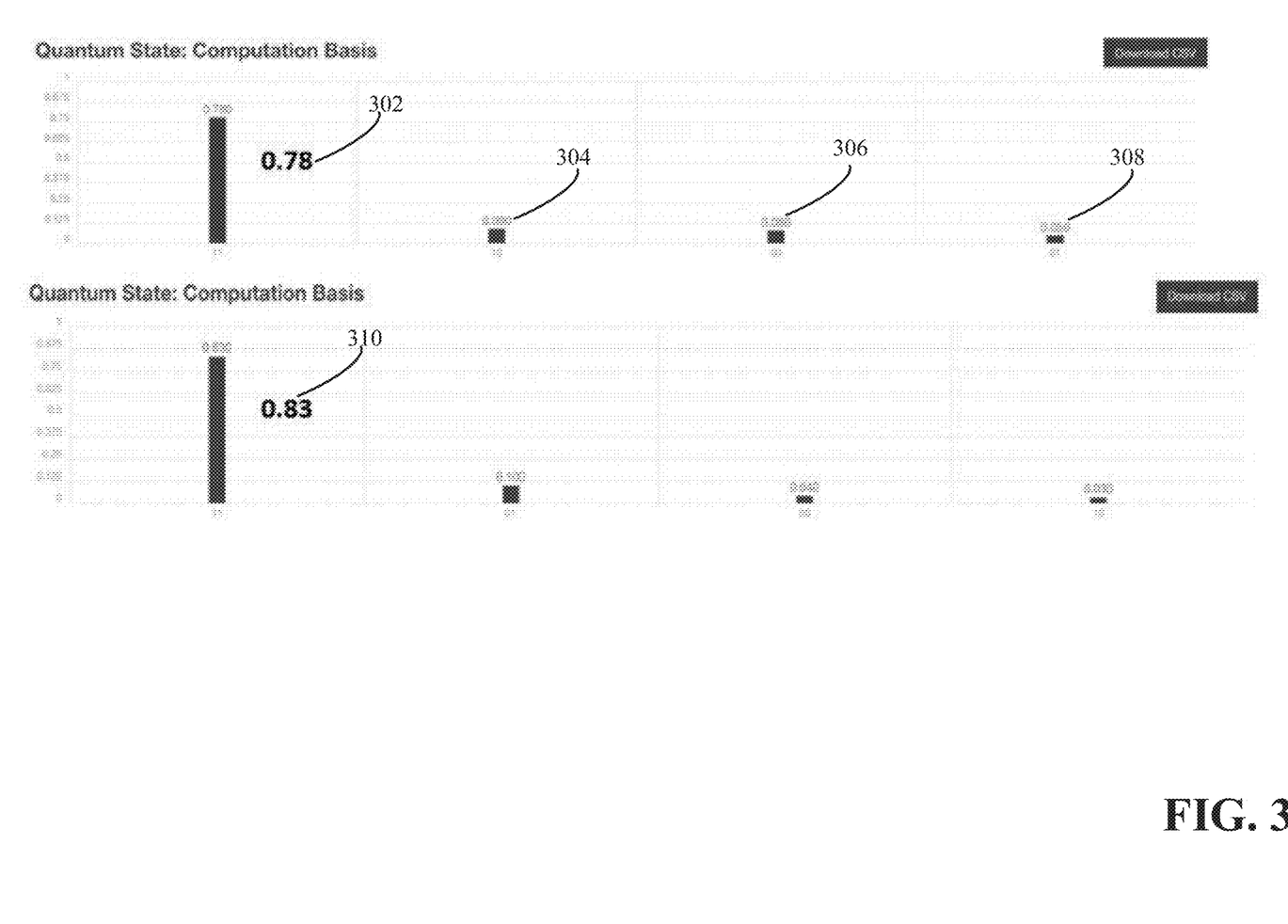
FIG. 3 illustrates the equivalency results of the 2 quantum circuits depicted in FIG. 2.

FIG. 3 illustrates an example of the results from the output equivalency measurement between the 2 circuits depicted in FIGS. 2 (202 & 204). The data can be depicted using IBM's Quantum Experience software and allows one to specify the number of runs (called "shots") for a test experiment and upon completion, shows the results as a histogram. Notice the results of the comparison depicted on FIG. 3 are displayed in histogram format. This diagram show the measurements of the equivalence of the quantum outputs in probability based results between quantum circuit (202) (after the H gates were removed and quantum circuit 2 (204) (with 2 H gates still inserted in the logic). The data is inconsistent and provides no confidence that the 2 circuits would generate an equivalent output. For circuit 202 (H gates removed) the probability value at the interval legend "11" is 0.78 (302). For circuit 204 (H gates still inserted) the probability value is at 0.83 (310). For each measurement in circuit 304, 306 and 308, the values are inconsistent at each interval further reflecting no-equivalency. The result chart depicted in drawing 3 is a common way to determine if 2 circuits would provide the same output value.

Figure 4:
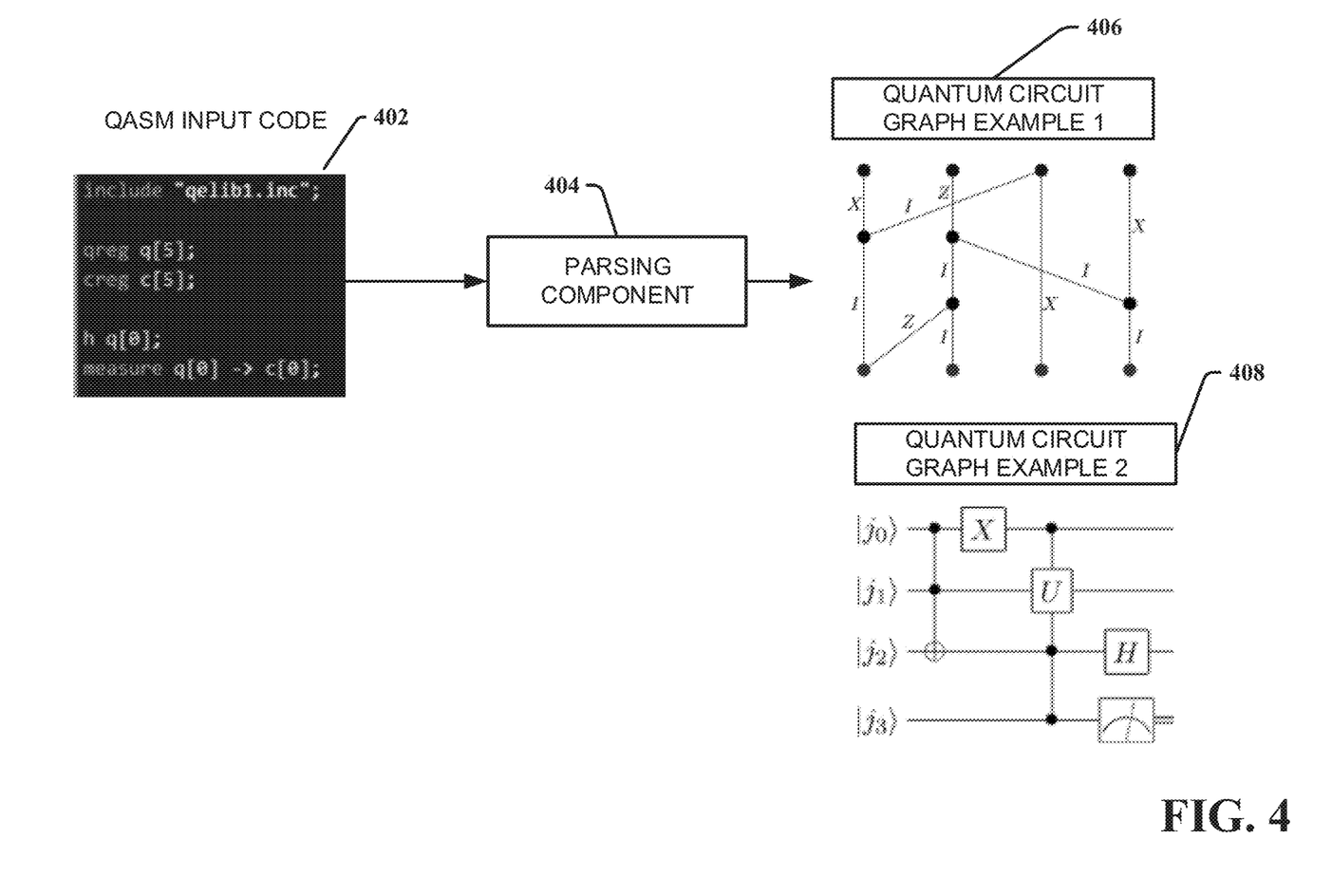
FIG. 4 illustrates the basic process flow of the input QASM program and the function of the parsing component.

FIG. 4 illustrates the basic process flow of the input QASM language program and the function of the parsing component. There is currently a lack of programming languages for describing quantum computation on a practical scale, i.e., not just at the level of simple problems. Along with QASM, there is the language QML, a functional language for quantum computations on finite types. There is QCL (Quantum Computation Language) which is a high level, architecture independent programming language for quantum computers along with others. 402 is the example QASM input text program which is parsed by the parsing component 404 and translated into a quantum circuit graph example such as 406 or 408 or other depictions. This circuit graph examples 406 or 408 are example representations of the QASM input code and will be utilized in its symbolic form. It should be noted that are many types of images that can be depicted as circuit graphs produced from QASM code.

Figure 5:
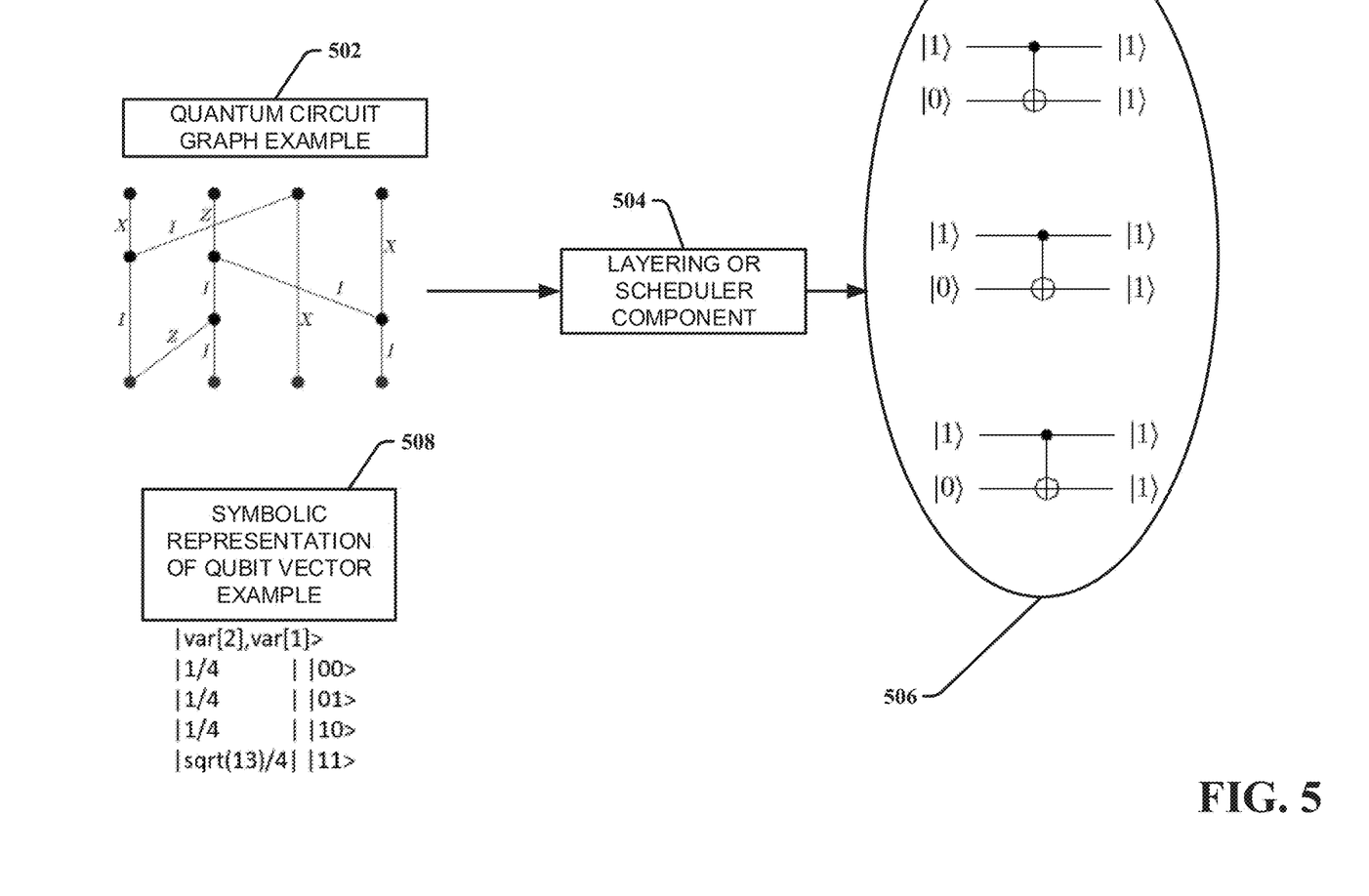
FIG. 5 illustrates the concept of the scheduler component which breaks the circuit graph into multiple layers.

FIG. 5 illustrates the visual depiction of the symbolic checking tool's layering component (can be referred to as the scheduler component also) which processes the quantum circuit graph into various circuit layers. Each layer represents its own circuit and is represented individually. It should be noted that the final output equivalence is based on the entire circuit and not each individual layer. In this diagram the example quantum circuit graph 502 is read in to the layering/scheduler component 504 which then proceeds to create multiple layers of circuits as shown in example 506. A quantum circuit does not have a standard limited number of layers but can be based on the complexity of the circuit. For this example, 506 depicts the circuit graph segmented into 3 specific circuit layers. It should be noted that there is no distinct connection between each circuit layer and a mathematical expression could be developed for each layer created. It should be noted that every entry is represented as a symbolic form (Example 508) when building the symbolic representation of the Qubit vector. Developing individual circuit layers from a circuit graph is common in quantum computing and provides greater visibility into the computing process.

Figure 6:
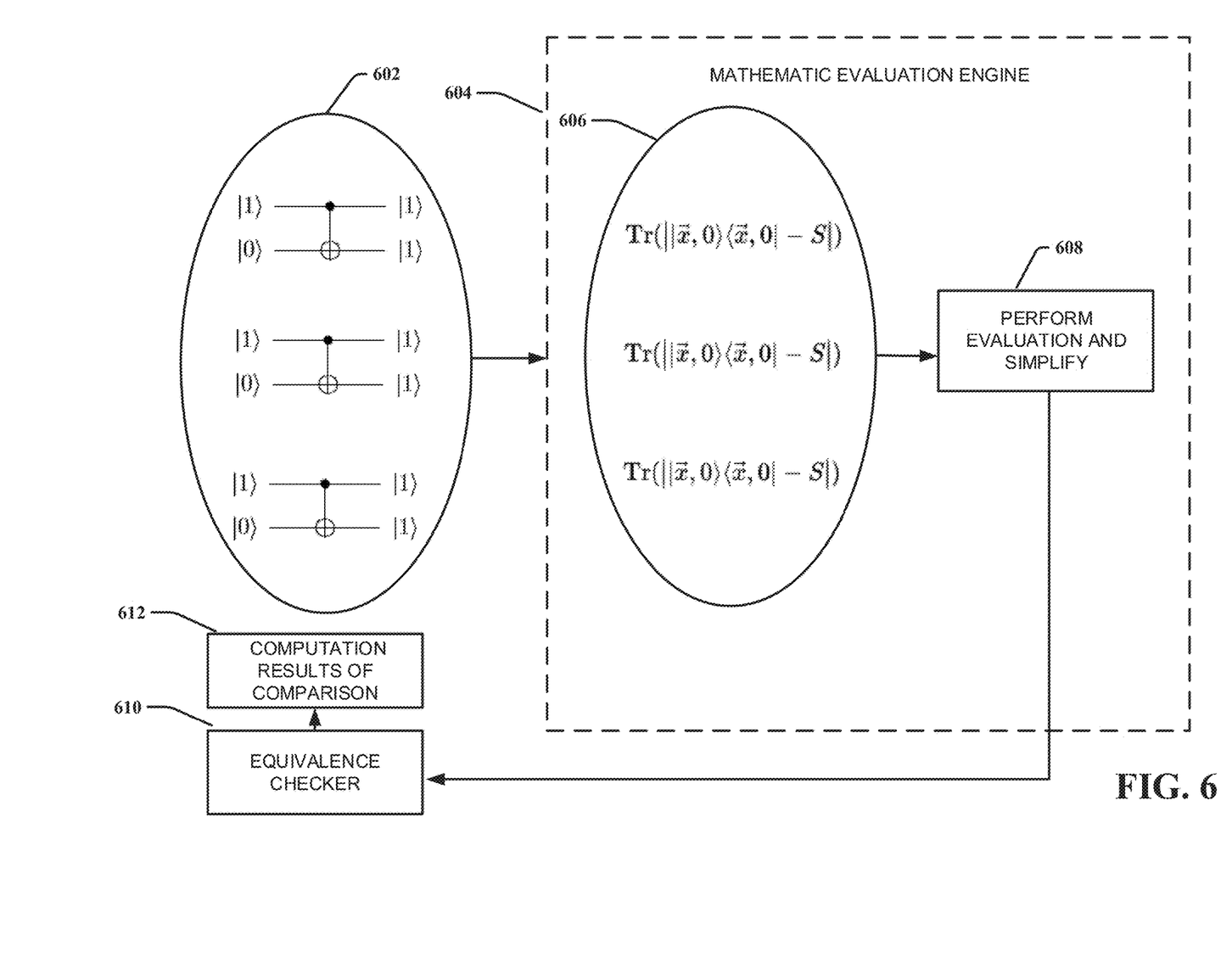
FIG. 6 illustrates the concept of the mathematic evaluation engine that reads each graphical layer, translates it to a mathematical expression over the Qubits and performs the evaluation and simplification.

FIG. 6 illustrates the concept of the mathematic evaluation engine in the symbolic tool that reads each graphical layer, translates it to a mathematical expression over the Qubits and performs the evaluation and simplification. For this drawing 602 is the same depiction as 506 in FIG. 5. This is the example representation of the circuit graph layered into 3 separate circuit layers. These circuit layers will be read in as individual quantum circuits to the mathematic evaluation engine 604. Subsequently, each circuit layer 602 is translated to an irreducible mathematical expression. The mathematical expression is a direct equivalent representation of the circuit itself. The symbolic tool proceeds to perform evaluation and simplification 608 upon these mathematical expressions to feed data into the equivalence checker 610. At that point the final task is indicate if the 2 output states are equal 612. To summarize the tool builds the symbolic representation of the qubit vector, where every entry is represented as a symbolic form: an irreducible mathematical expression that precisely describes the amplitude value. Based on the symbolic form, the tool can check if two output states from 2 QASM files are equivalent by checking:

Does S1=S2 or more generally does S1*e^ix=S2

Figure 7:
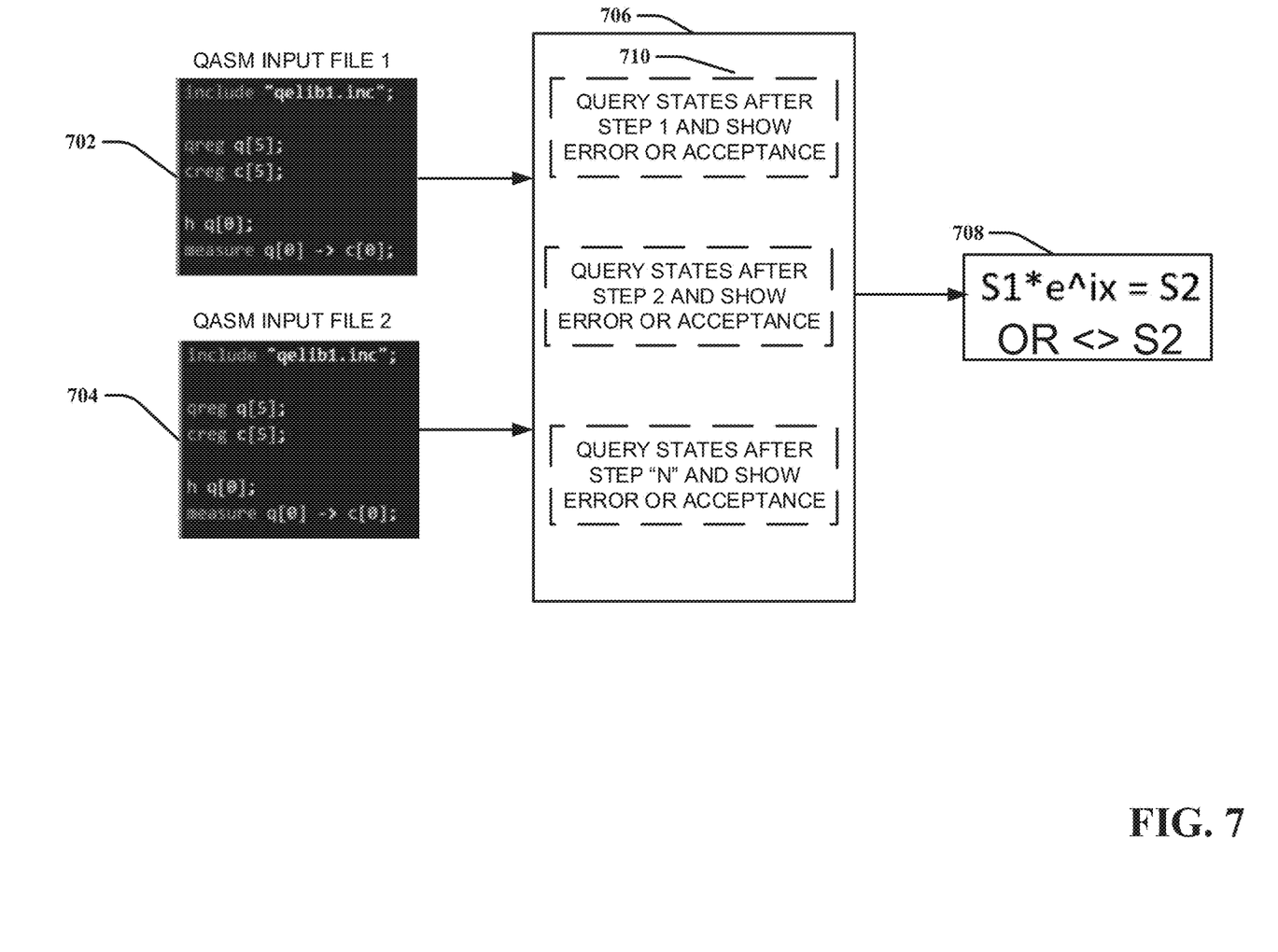
FIG. 7 illustrates the concept of the additional functionality of the tool as a debugger.

FIG. 7 illustrates the overview of the symbolic checking tool 706 with a dual function as a debugger (710). A debugger is a computer program used by programmers to test and debug a target program. Debuggers may use instruction-set simulators, rather than running a program directly on the processor to achieve a higher level of control over its execution. This allows debuggers to stop or halt the program according to specific conditions. However, use of simulators decreases execution speed. When a program crashes, debuggers show the position of the error in the target program. Most debuggers also are capable of running programs in a step-by-step mode, besides stopping on specific points. They also can often modify the state of programs while they are running. The concept is that as previously stated the QASM files 702 and 704 are inputs in to the symbolic tool and the tool proceeds through various steps in arriving to a conclusion, during these steps the tool also functions as a debugger in the process. The tool will query states after every state and inform the user about its correctness as typical debuggers behave. The debugger may use various methods such as the step may be color coded for indicating acceptance or rejection well. As the steps proceed and if each of the steps are accepted by the debugger as correct, the symbolic tool will provide the final answer of equivalence as shown in 708.

Figure 8:
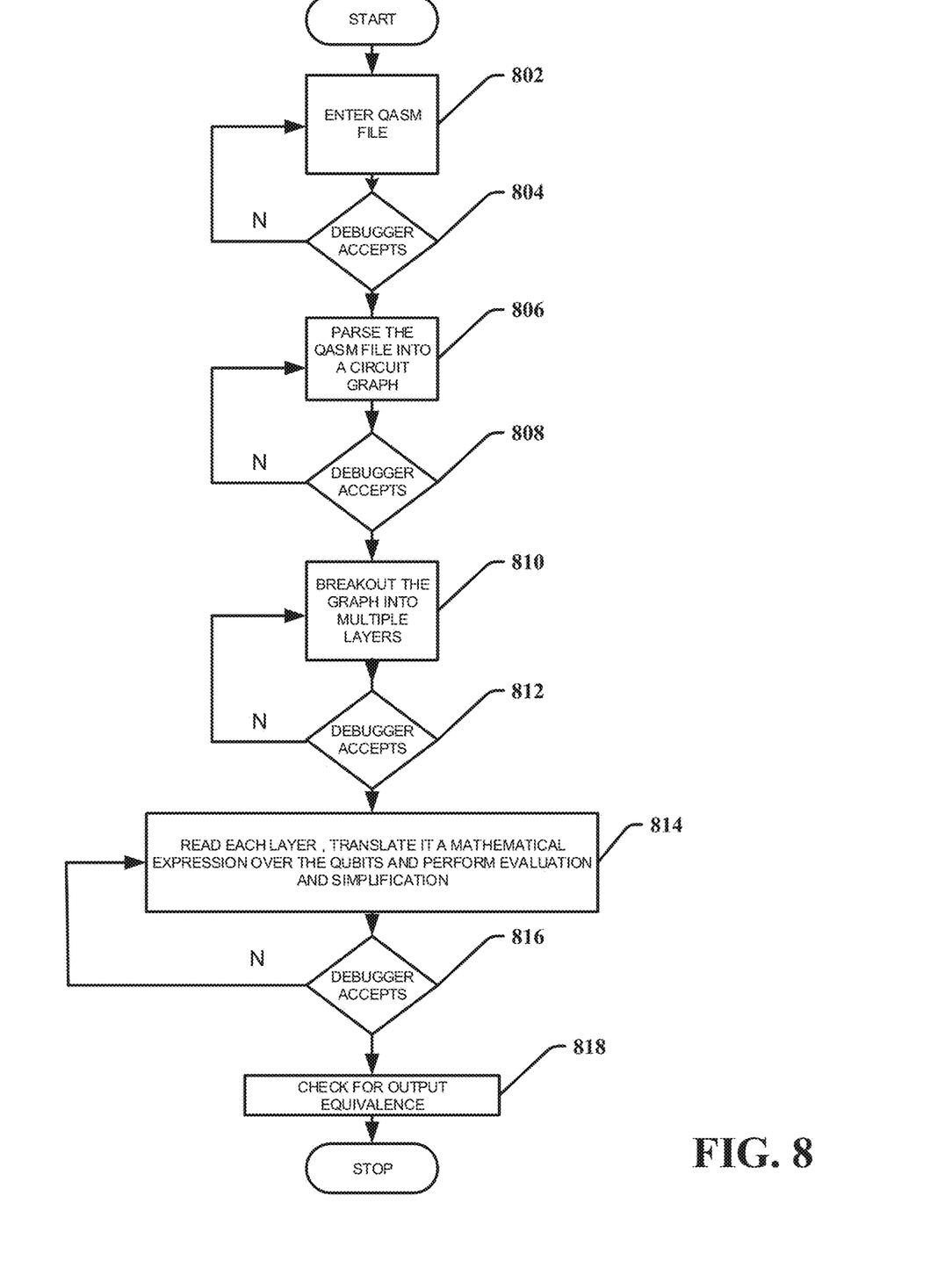
FIG. 8 illustrates the process flowchart of the symbolic check.

FIG. 8 illustrates the flow chart of the symbolic tool execution process. The first step of the symbolic tool process is the input of the QASM file 802. As the file is input into the tool, the debugger 804 interrogates the file as a typical debugger and indicates if the file is acceptable or cannot be accepted due to specific reasons (such as for example incorrect formatting). If the debugger accepts the file, the next step in the process is parse 806 the QASM into a representative circuit graph of the code. The debugger can verify each step and steps that are not reflected in this flow chart. If the parsing into the circuit graph is rejected by the debugger, a new circuit graph cannot be created and it may indicate a problem with the conversion or other error. If the debugger accepts 808, the next step is for the tool to breakout the circuit graph into multiple layers 810. The debugger again 812 will verify the step is acceptable for compiling. Subsequently the mathematical evaluation engine will read each layer and translate the layer to a irreducible mathematical expression over the Qubits 814. The next step will be for the tool to check for equivalence 818 if the process is approved by the debugger 816. At 818, the final answer for output equivalence is provided in probability form.

Figure 9:
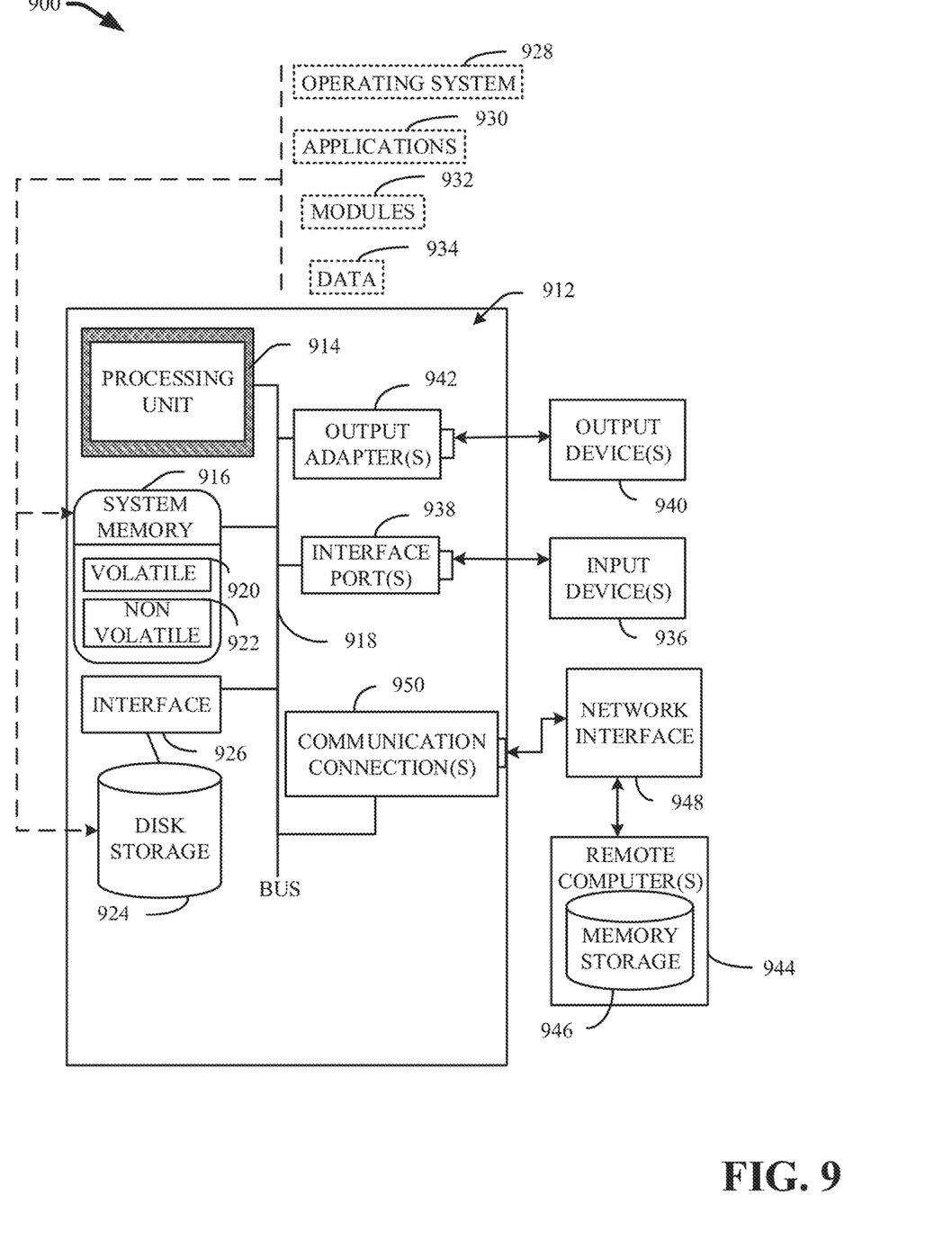
FIG. 9 is a schematic diagram of an example operating environment in accordance with one or more implementations described herein.

A suitable operating environment 900 for implementing various aspects of this disclosure can also include a computer 912. The computer 912 can also include a processing unit 914, a system memory 916, and a system bus 918. The system bus 918 couples system components including, but not limited to, the system memory 916 to the processing unit 914. The processing unit 914 can be any of various available processors. Dual microprocessors and other multiprocessor architectures also can be employed as the processing unit 914. The system bus 918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1094), and Small Computer Systems Interface (SCSI). The system memory 916 can also include volatile memory 920 and nonvolatile memory 922. The basic input/output system (BIOS), containing the basic routines to transfer information between elements within the computer 912, such as during start-up, is stored in nonvolatile memory 922. By way of illustration, and not limitation, nonvolatile memory 922 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 920 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 912 can also include removable/non-removable, volatile/non-volatile computer storage media. FIG. 9 illustrates, for example, a disk storage 924. Disk storage 924 can also include, but is not limited to, devices like a magnetic disk drive, floppy disk drive, tape drive, Jaz drive, Zip drive, LS-100 drive, flash memory card, or memory stick. The disk storage 924 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 924 to the system bus 918, a removable or non-removable interface is typically used, such as interface 926. FIG. 9 also depicts software that acts as an intermediary between users and the basic computer resources described in the suitable operating environment 900. Such software can also include, for example, an operating system 928. Operating system 928, which can be stored on disk storage 924, acts to control and allocate resources of the computer 912. System applications 930 take advantage of the management of resources by operating system 928 through program modules 932 and program data 934, e.g., stored either in system memory 916 or on disk storage 924. It is to be appreciated that this disclosure can be implemented with various operating systems or combinations of operating systems. A user enters commands or information into the computer 912 through input device(s) 936. Input devices 936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 914 through the system bus 918 via interface port(s) 938. Interface port(s) 938 include, for example, a serial port, a parallel port, a game port, and a universal serial bus (USB). Output device(s) 940 use some of the same type of ports as input device(s) 936. Thus, for example, a USB port can be used to provide input to computer 912, and to output information from computer 912 to an output device 940. Output adapter 942 is provided to illustrate that there are some output devices 940 like monitors, speakers, and printers, among other output devices 940, which require special adapters. The output adapters 942 include, by way of illustration and not limitation, video and sound cards that provide a means of connection between the output device 940 and the system bus 918. It should be noted that other devices and/or systems of devices provide both input and output capabilities such as remote computer(s) 944.

Computer 912 can operate in a networked environment using logical connections to one or more remote computers, such as remote computer(s) 944. The remote computer(s) 944 can be a computer, a server, a router, a network PC, a workstation, a microprocessor based appliance, a peer device or other common network node and the like, and typically can also include many or all the elements described relative to computer 912. For purposes of brevity, only a memory storage device 946 is illustrated with remote computer(s) 944. Remote computer(s) 944 is logically connected to computer 912 through a network interface 948 and then physically connected via communication connection 950. Network interface 948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 950 refers to the hardware/software employed to connect the network interface 948 to the system bus 918. While communication connection 950 is shown for illustrative clarity inside computer 912, it can also be external to computer 912. The hardware/software for connection to the network interface 948 can also include, for exemplary purposes only, internal and external technologies such as, modems including regular telephone grade modems, cable modems and DSL modems, ISDN adapters, and Ethernet cards.

Embodiments of the present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in one or more computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that one or more blocks of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, one or more blocks in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that one or more block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products, and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
    a memory that stores computer-executable components;
    a processor, operably coupled to the memory, and that executes the computer-executable components stored in the memory, wherein the computer-executable components comprise:
        a parser component that receives an input qasm and parses it as a circuit graph;
        a layering component that segments the circuit graph into multiple layers;
        an evaluation engine that reads respective layers, translates the respective layers into a mathematic expression over qubits, and performs a simplification of the input qasm; and
        a checker that determines whether the input qasm and the simplified qasm are equivalent, wherein prior to determining the equivalency, the checker modifies an amount or a type of one or more gates of the input qasm.

2. The system of claim 1, wherein a symbolic representation of a qubit vector is built, and respective entries are represented in symbolic form.

3. The system of claim 2, wherein the symbolic representation is an irreducible mathematical expression.

4. The system of claim 2, wherein the symbolic representation describes amplitude value of the qubit vector.

5. The system of claim 1, wherein based on symbolic representation a determination can be made as to whether two output states are equivalent by checking:

$$S1=S2.$$

6. The system of claim 1, wherein based on symbolic representation a determination can be made as to whether two output states are equivalent by checking:

$$S1*e^{ix}=S2.$$

7. The system of claim 1 employed as a single step debugger.

8. The system of claim 7, wherein the single step debugger queries states after respective steps and reasons about step correctness.

9. A computer-implemented method, comprising:
    receiving, by a processor operative coupled to a memory, an input qasm and parsing it as a circuit graph;
    segmenting, by the processor, the circuit graph into multiple layers;
    reading, by the processor, respective layers and translating the respective layers into a mathematic expression over qubits, and performs a simplification of the input qasm; and
    determining, by the processor, whether the input qasm and the simplified qasm are equivalent, wherein prior to the determining the equivalency, modifying, by a checker, an amount or a type of one or more gates of the input qasm.

10. The method of claim 9, further comprising building, by the processor, a symbolic representation of a qubit vector, and representing respective entries in symbolic form.

11. The method of claim 10, wherein the symbolic representation is an irreducible mathematical expression.

12. The method of claim 10, wherein the symbolic representation describes amplitude value of the qubit vector.

13. The method of claim 9, wherein based on symbolic representation a determination is made as to whether two output states are equivalent by checking:

$$S1=S2.$$

14. The method of claim 9, wherein based on symbolic representation a determination is made as to whether two output states are equivalent by checking:

$$S1*e^{ix}=S2.$$

15. The method of claim 9 employed as a single step debugger.

16. The method of claim 15, wherein the single step debugger queries states after respective steps and reasons about step correctness.

17. A computer program product, comprising a computer readable storage medium having program instructions embodied therewith, the program instructions executable by a processor to cause the processor to:
    receive, by a processor operative coupled to a memory, an input qasm and parsing it as a circuit graph;

segment, by the processor, the circuit graph into multiple layers;

read, by the processor, respective layers and translating the respective layers into a mathematic expression over qubits, and performs a simplification of the input qasm; and determine, by the processor, whether the input qasm and the simplified qasm are equivalent, wherein prior to determining the equivalency, modify, by a checker, an amount or a type of one or more gates of the input qasm.

18. The computer program product of claim 17, wherein the program instructions further cause the processor to build, by the processor, a symbolic representation of a qubit vector, and representing respective entries in symbolic form.

19. The computer program product of claim 18, wherein the symbolic representation is an irreducible mathematical expression.

20. The computer program product of claim 18, wherein the symbolic representation describes amplitude value of the qubit vector.

* * * * *